US011006543B2

(12) United States Patent
Huangfu et al.

(10) Patent No.: US 11,006,543 B2
(45) Date of Patent: May 11, 2021

(54) COVER ASSEMBLY FOR EQUIPMENT RACK

(71) Applicant: SCHNEIDER ELECTRIC IT CORPORATION, West Kingston, RI (US)

(72) Inventors: Bo Huangfu, Shanghai (CN); Lars Juhl Lindholm, Christiansfeld (DK)

(73) Assignee: SCHNEIDER ELECTRIC IT CORPORATION, Foxboro, MA (US)

( * ) Notice: Subject to any disclaimer, the term of this patent is extended or adjusted under 35 U.S.C. 154(b) by 0 days.

(21) Appl. No.: 16/801,708

(22) Filed: Feb. 26, 2020

(65) Prior Publication Data

US 2020/0281090 A1    Sep. 3, 2020

(30) Foreign Application Priority Data

Feb. 28, 2019   (CN) .......................... 201910153293.X (51) Int. Cl.
*H05K 7/14*    (2006.01)
*H05K 5/03*    (2006.01)

(52) U.S. Cl.
CPC ............. *H05K 7/1492* (2013.01); *H05K 5/03* (2013.01); *H05K 7/1489* (2013.01)

(58) Field of Classification Search
CPC combination set(s) only.
See application file for complete search history.

(56) References Cited

U.S. PATENT DOCUMENTS

| 8,305,756 | B2 * | 11/2012 | Regimbal ............ H05K 7/2019 |
| | | | 361/695 |
| 8,528,872 | B2 * | 9/2013 | Mattlin ................... G06F 1/181 |
| | | | 248/221.11 |
| 8,678,524 | B2 * | 3/2014 | Green .................. H05K 7/1489 |
| | | | 312/223.2 |
| 9,723,756 | B1 * | 8/2017 | Masters ............ H05K 7/20709 |
| 2003/0111939 | A1 | 6/2003 | Tonozuka |
| 2012/0155033 | A1 | 6/2012 | Li et al. |
| 2013/0286576 | A1 * | 10/2013 | Toya .................... H05K 7/1495 |
| | | | 361/679.02 |
| 2014/0177164 | A1 * | 6/2014 | Stewart ............. H05K 13/0486 |
| | | | 361/679.46 |

(Continued)

OTHER PUBLICATIONS

Extended European Search Report from corresponding European Application No. 20159281.3 dated Aug. 3, 2020.

*Primary Examiner* — Lisa Lea-Edmonds
(74) *Attorney, Agent, or Firm* — Lando & Anastasi, LLP (57) ABSTRACT

A cover assembly is provided to prevent access within a mounting slot of an equipment rack. The assembly includes a cover sufficiently sized to block access to a back of the equipment rack that includes an open power source. The cover is secured to frame members by at least one hinge. The cover is configured to rotate between a closed position in which the cover blocks access to the open power source and an open position in which the cover is rotated to enable installation of a power module in the mounting slot. The assembly further includes a first spring stop lock provided the first frame member. The first spring stop lock is configured to lock the cover in the closed position and to release the cover to enable an installation of the power module within the mounting slot of the equipment rack.

20 Claims, 8 Drawing Sheets

(56) References Cited

U.S. PATENT DOCUMENTS

| | | | |
|---|---|---|---|
| 2014/0352107 A1* | 12/2014 | Cox | H05K 5/0226 |
| | | | 16/50 |
| 2016/0044819 A1 | 2/2016 | Bailey et al. | |
| 2019/0021178 A1* | 1/2019 | Zumbek | H04Q 1/025 |
| 2019/0350103 A1* | 11/2019 | Sassano | H05K 5/0226 |
| 2019/0364681 A1* | 11/2019 | Hangebrauck | E05C 1/02 |

\* cited by examiner

COVER ASSEMBLY FOR EQUIPMENT RACK

CROSS-REFERENCE TO RELATED APPLICATION

This application claims the benefit under 35 U.S.C. § 119 of Chinese Patent Application No. 201910153293.X filed Feb. 28, 2019 which is hereby incorporated herein by reference in its entirety for all purposes.

BACKGROUND OF DISCLOSURE

1. Field of Disclosure

Embodiments of the disclosure relate generally to safety features, and more specifically, to a safety cover assembly that is used within an equipment rack to prevent unwanted access to powered electrical components, such as busbars, within the equipment rack.

2. Discussion of Related Art

Centralized data centers for computer, communications and other electronic equipment have been in use for a number of years. More recently, with the increasing use of the Internet, large scale data centers that provide hosting services for Internet Service Providers (ISPs), Application Service Providers (ASPs) and Internet content providers have become increasingly popular. It is often desirable to operate equipment within data centers seven days a week, 24 hours per day, with little or no disruption in service. To prevent any disruption in service, it is common practice in data centers to use uninterruptible power supplies (UPSs) provided in equipment racks to ensure that the equipment within the data centers receives continuous power throughout any black out or brown out periods. Typically, data centers are equipped with a relatively large UPS at the main power distribution panel for the facility. Often, the UPS is selected to have sufficient capacity to meet the power requirements for all of the equipment within the facility.

The use of the UPS to provide power to a critical load is well known in the art. The UPS is designed to protect electronic equipment from utility power blackouts, brownouts, sags and surges. The UPS may also protect electronic equipment from small utility fluctuations and large disturbances. In most rack configurations, the UPS provides battery backup until utility power returns to safe levels or the batteries are fully discharged. The configurable rack may include power distribution modules and batteries to form the UPS, and other pieces of equipment required to operate the uninterruptible power supply. These modules are rack-mounted in the well-known manner.

A typical power distribution unit consists of a rack frame chassis and removable power distribution modules or power modules for short, which are often removed for replacement or service. The power modules connect to a live busbar provided at a rear of the equipment rack, and when the power module is removed, the live busbar is exposed. Often, the equipment rack includes a warning label to power down the equipment rack when working near the busbar, but such a label oftentimes can be ineffective. Other approaches have been tried, such as installing a blanking panel to block access to the live busbar. However, this approach, when implemented, requires additional time and parts.

SUMMARY OF DISCLOSURE

One aspect of the present disclosure is directed to a cover assembly for preventing access within a mounting slot of an equipment rack. The equipment rack includes a chassis having an open power source located at a back of the chassis and first and second frame members that define a mounting slot configured to receive a power module in a position in which the power module engages the open power source. In one embodiment, the assembly includes a cover sufficiently sized to block access to the back of the equipment rack. The cover is secured to the frame members by at least one hinge. The cover is configured to rotate between a closed position in which the cover blocks access to the open power source and an open position in which the cover is rotated to enable installation of a power module in the mounting slot. The assembly further includes a first spring stop lock provided the first frame member. The first spring stop lock is configured to lock the cover in the closed position and to release the cover to enable an installation of the power module within the mounting slot of the equipment rack.

Embodiments of the assembly further may include positioning the first spring stop lock within a first slot formed in the first frame member. The cover assembly further may include a second spring stop lock provided in the second frame member. The second spring stop lock may be configured to lock the cover in the closed position and to release the cover to enable an installation of the power module within the mounting slot of the equipment rack. The second spring stop lock may be positioned within a second slot formed in the second frame member. Each spring stop lock may embody a flat spring including a flat end that is secured to its respective frame member of the chassis of the equipment rack. Each spring stop lock further may include includes a bent portion and an inwardly bent opposite end. The bent portion may extend inboard within the mounting slot into the interior of the chassis with respect to its respective frame member. The bent end may extend perpendicularly within the interior of the chassis to maintain the cover in the closed position when a power module is not positioned within the mounting slot. The spring stop lock further may include a stop to maintain the cover in the closed position and to prevent unwanted movement of the cover to the open position to access the back of the equipment rack. The at least one hinge may extend along a top edge of the cover beyond side edges of the cover, with opposite ends of the hinge extending through respective openings of the frame members. The cover assembly further may include a spring to drive the cover to the closed position. The spring may be a helical torsion spring that is mounted on one end of the hinge. The spring may have one end secured to the first frame member through a small opening provided in the frame member and another end that engages a surface of the cover that faces the back of the equipment rack.

Another aspect of the disclosure is directed to a method of selectively blocking access to a portion of an equipment rack within a mounting slot of a chassis of the equipment rack with a cover assembly. In one embodiment, the method comprises: mounting a cover of the cover assembly within the mounting slot, the cover being sufficiently sized to block access to a back of the equipment rack to prevent access to an open power source, the cover being secured to first and second frame members of the chassis by at least one hinge, the cover being configured to rotate between a closed position in which the cover blocks access to the open power source and an open position in which the cover is rotated to enable installation of a power module in the mounting slot; and selectively locking the cover in the closed position with a first spring stop lock provided the first frame member, the first spring stop lock being configured to lock the cover in the closed position and to release the cover to enable an installation of the power module within the mounting slot of the equipment rack.

Embodiments of the method further may include positioning the first spring stop lock within a first slot formed in the first frame member and positioning a second spring stop lock within a second slot formed in the second frame member. Each spring stop lock may embody a flat spring including a flat end that is secured to the frame member of the chassis of the equipment rack, a bent portion, and an inwardly bent opposite end. The bent portion may extend inboard within the mounting slot into the interior of the chassis with respect to the frame member. The bent end may extend perpendicularly within the interior of the chassis to maintain the cover in the closed position when a power module is not positioned within the mounting slot. The method further may include biasing a movement of the cover to the closed position with a spring.

Yet another aspect of the present disclosure is directed to an equipment rack including a chassis, an open power source located at a back of the chassis, first and second frame members that define a mounting slot configured to receive a power module in a position in which the power module engages the open power source, and a cover assembly including a cover sufficiently sized to block access to the back of the equipment rack. The cover is secured to the frame members by at least one hinge. The cover is configured to rotate between a closed position in which the cover blocks access to the open power source and an open position in which the cover is rotated to enable installation of a power module in the mounting slot. The cover assembly further includes a first spring stop lock provided the first frame member. The first spring stop lock is configured to lock the cover in the closed position and to release the cover to enable an installation of the power module within the mounting slot of the equipment rack.

Embodiments of the equipment rack further may include positioning the first spring stop lock within a first slot formed in the first frame member. The equipment rack further may include a second spring stop lock positioned within a second slot formed in the second frame member. Each spring stop lock may embody a flat spring having a flat end that is secured to its respective frame member of the chassis of the equipment rack, a bent portion, and an inwardly bent opposite end. The bent portion may extend inboard within the mounting slot into the interior of the chassis with respect to its respective frame member.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

This disclosure is not limited in its application to the details of construction and the arrangement of components set forth in the following description or illustrated in the drawings. The principles set forth in this disclosure are capable of being provided in other embodiments and of being practiced or of being carried out in various ways. Also, the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

Figure 1:
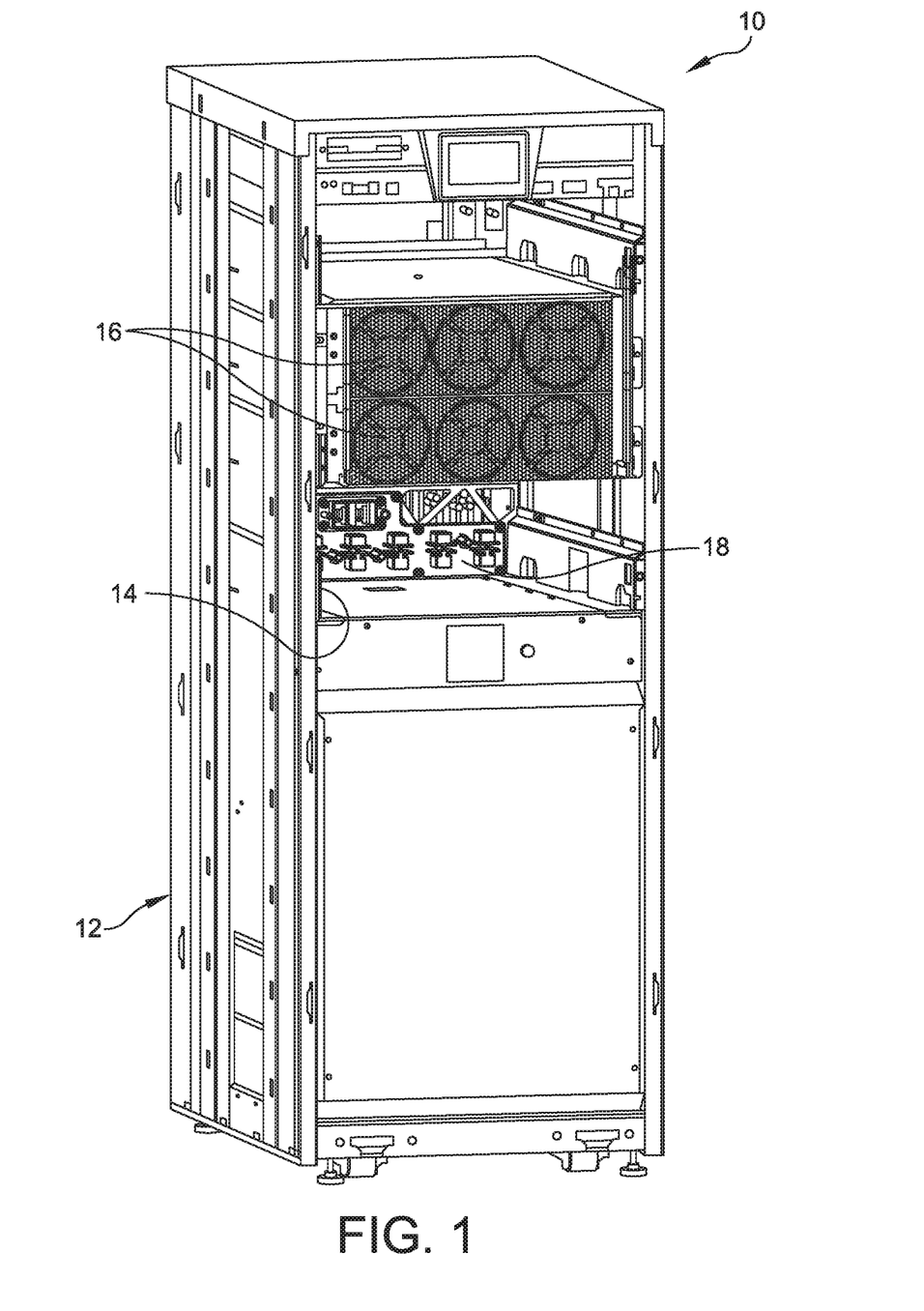
FIG. 1 is a perspective view of a standard equipment rack.
Figure 2:
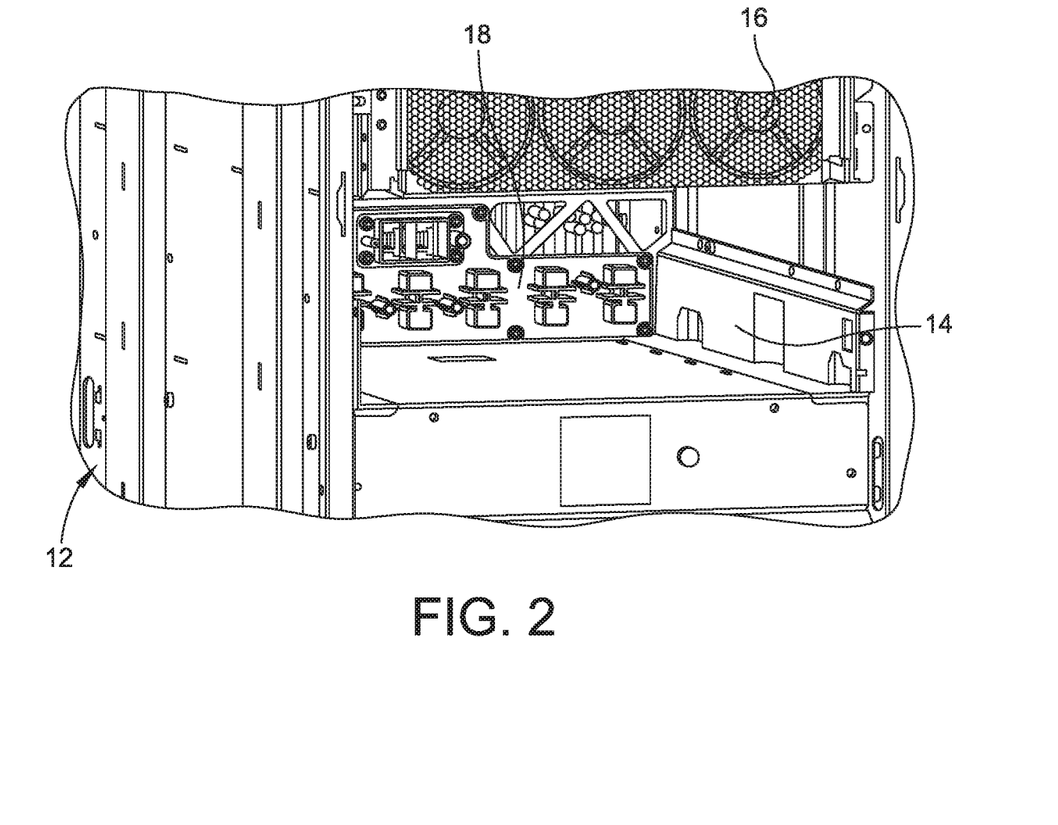
FIG. 2 is an enlarged perspective view of an interior of the equipment rack shown in FIG. 1.

The present disclosure is directed to a safety cover assembly that is configured to prevent unwanted access to a live busbar located at a back of an equipment rack after removing a power module or other electronic device from the equipment rack. Referring to FIGS. 1 and 2, an equipment rack or rack enclosure, generally indicated at 10, is constructed in the well-known manner. In one embodiment, the equipment rack 10 includes a chassis, or frame structure, generally indicated at 12, that defines an enclosure. The chassis 12 includes an open front having several mounting slots, each indicated at 14, that are each configured to slidably receive electronic components, such as power modules, each indicated at 16. Once installed, the power modules 16 engage a busbar 18 provided at a back of the chassis 12 in the well-known manner to provide power to the power modules. Although a busbar 18 is shown, the chassis 12 of the rack enclosure may include live wire provided to power equipment housed within the equipment rack, including the power modules 16.

The exemplary equipment rack 10 shown in FIGS. 1 and 2 illustrate two power modules 16 installed within respective mounting slots 14 provided in the equipment rack 10, with an empty mounting slot positioned below the two power modules. It should be noted that the equipment rack 10 can be configured to accommodate any number of power modules 16, with the size of the mounting slots being dependent on the size of the power modules received within the mounting slots. In particular, the equipment rack includes multiple mounting slots, sometimes called bays, with each bay being configured to hold the power module in place. As shown, the power modules 16 provided within the equipment rack 10 are stacked one above the other; however, the equipment rack can be configured so that the power modules are vertically oriented and positioned side-by-side with respect to one another.

In one embodiment, once installed, the power module 16 engages the busbar 18 to provide power to the power module. As mentioned above, the power module 16 can be removed from its respective mounting slot 14 to replace the power module or to repair the power module. Once removed, as shown in FIG. 2, unless blocked off by a blanking panel mounted on a front surface of the equipment rack in front of the mounting slot 14 or within an interior of the equipment rack 10, a technician or other person is able to access the busbar 18, which can be dangerous if the technician is not careful.

Figure 3:
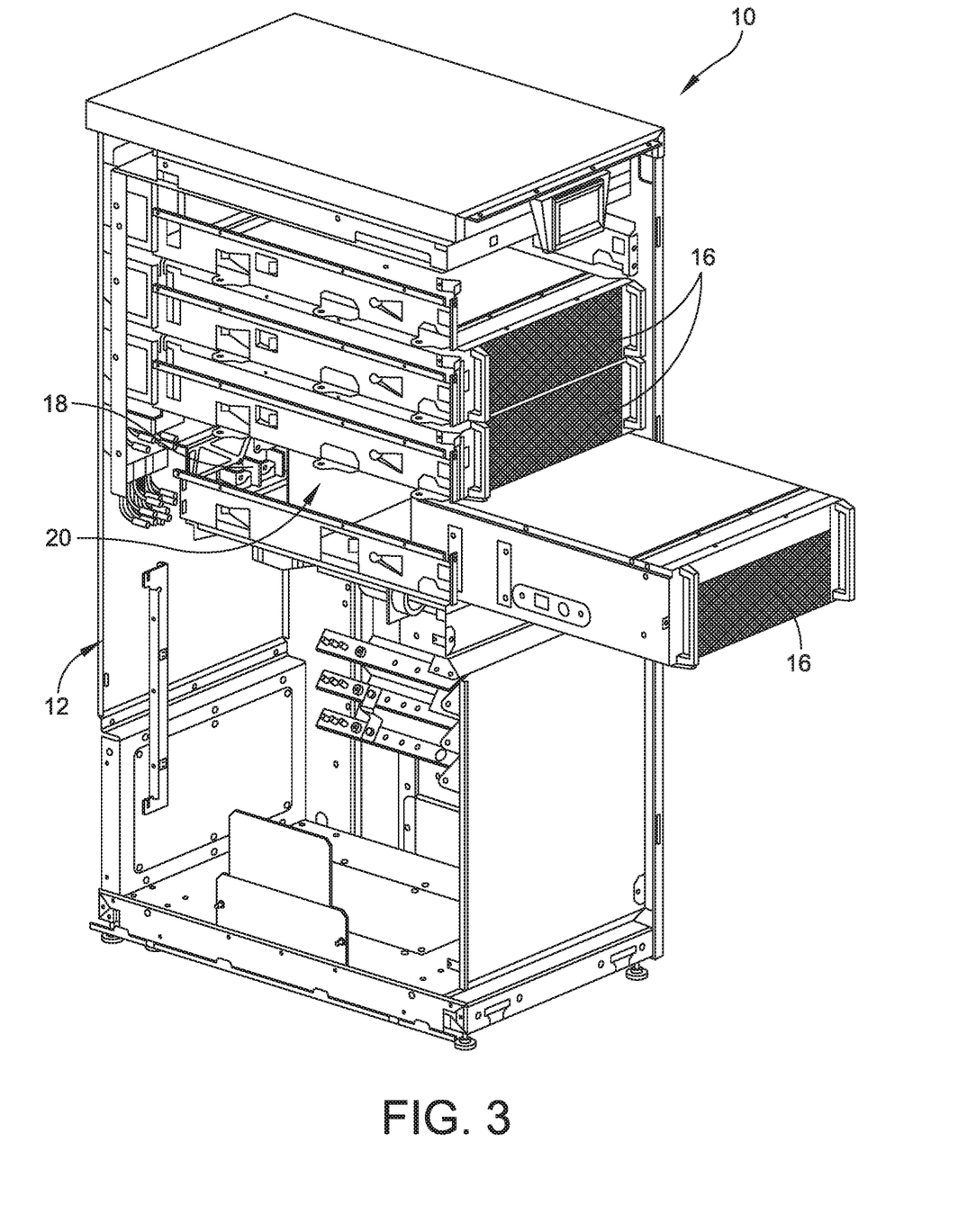
FIG. 3 is a perspective view of an equipment rack with a side panel removed to reveal an interior of the equipment rack, the equipment rack having a safety cover assembly of an embodiment of the present disclosure.

Referring to FIG. 3, a power module 16 is positioned at the front of the chassis 12 of the equipment rack 10 prior to being installed within the equipment rack. As shown, a safety cover assembly of an embodiment of the present disclosure, generally indicated at 20, is provided approximately midway between the front of the equipment rack 10 to the back of the equipment rack within the mounting slot 14 in which the power module 16 is being installed. It should be noted that the safety cover assembly 20 can be provided at any point along a length of the mounting slot 14, e.g., adjacent the front or entrance of the mounting slot. The safety cover assembly 20 is configured to block the busbar 18 provided at the back of the chassis 12 of the equipment rack 10 to prevent unwanted access to the busbar and to control heat produced by the busbar when in a closed position. The safety cover assembly 20 is further configured to enable the installation of the power module 16 by moving to an out-of-way or open position in which the power module may be fully inserted within the mounting slot 14 so that it electrically engages the busbar 18. The safety cover assembly 20 enables the power module 16 to be installed and removed without the use of tools, and is robust enough to prohibit access to the busbar 18 when in a closed position. The safety cover assembly 20 can also be provided to block accesses to an open power source, including power cables, or live wires provided at the back of the chassis 12 of the equipment rack 10.

Figure 4:
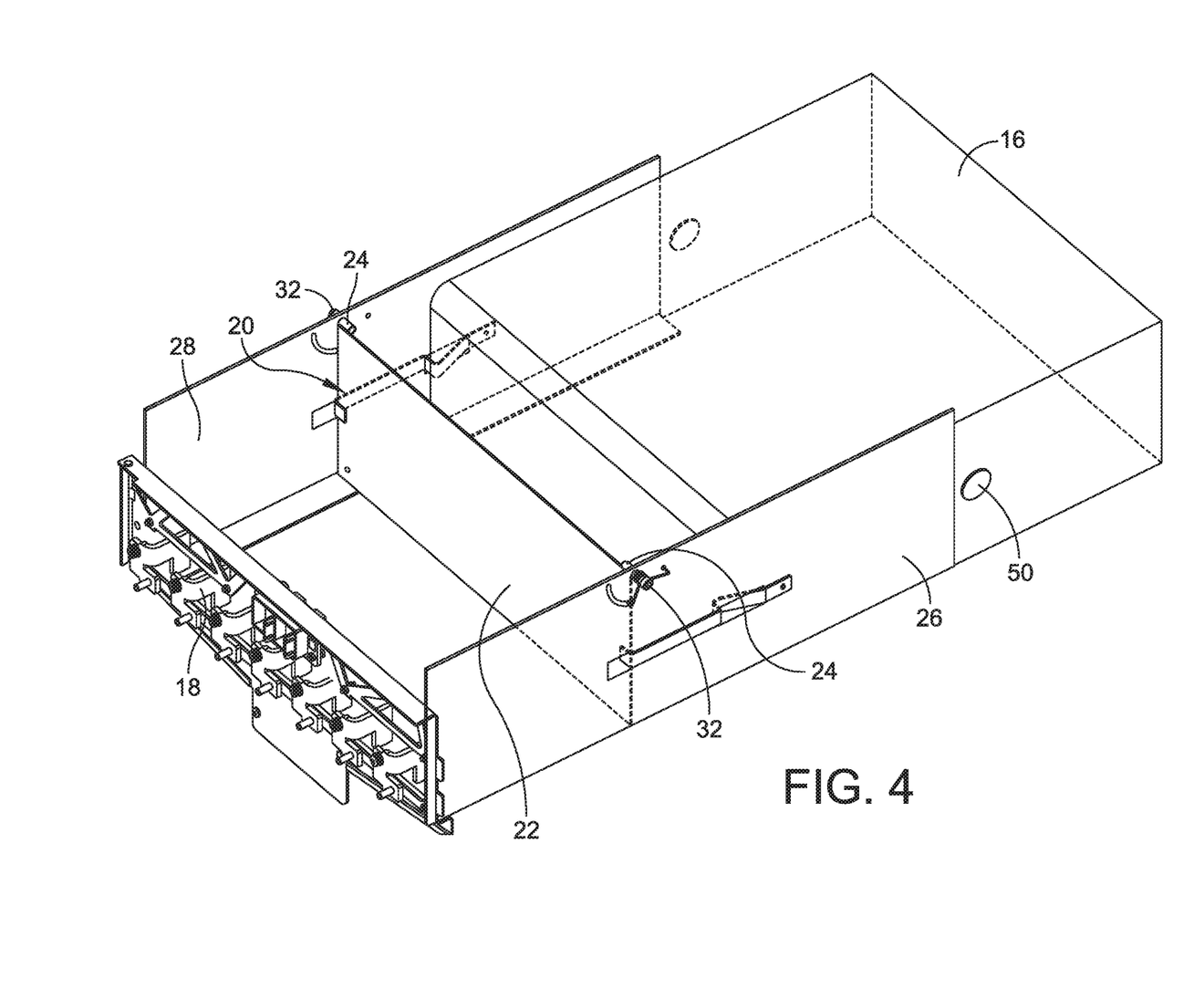
FIG. 4 is an enlarged perspective view of the safety cover assembly in conjunction with portions of the equipment rack and a power module.

Referring to FIG. 4, the safety cover assembly 20 includes a cover or panel 22 that can be fabricated from sheet metal or hard plastic. In the shown embodiment, the cover 22 is sufficiently sized to block access to the back of the equipment rack within the particular mounting slot 14 in which the cover is installed. For example, the cover 22 has a width and a height that are slightly less than a width and a height of the mounting slot 14 of the equipment rack 10 to prevent the technician or other person from going around the cover to reach or otherwise access the busbar 18. The cover 22 includes a hinge or spindle 24 to secure the cover to frame members 26, 28 of the chassis 12 of the equipment rack 10. As shown, the frame members 26, 28 are parallel to one another and form respective sides of the mounting slot 14. In one embodiment, the hinge 24 extends along a top edge of the cover 22 beyond side edges of the cover. In this embodiment, opposite ends of the hinge 24 extend through respective openings 30 formed in the frame members 26, 28 and are secured to prevent unwanted removal of the hinge from the frame members.

Figure 5:
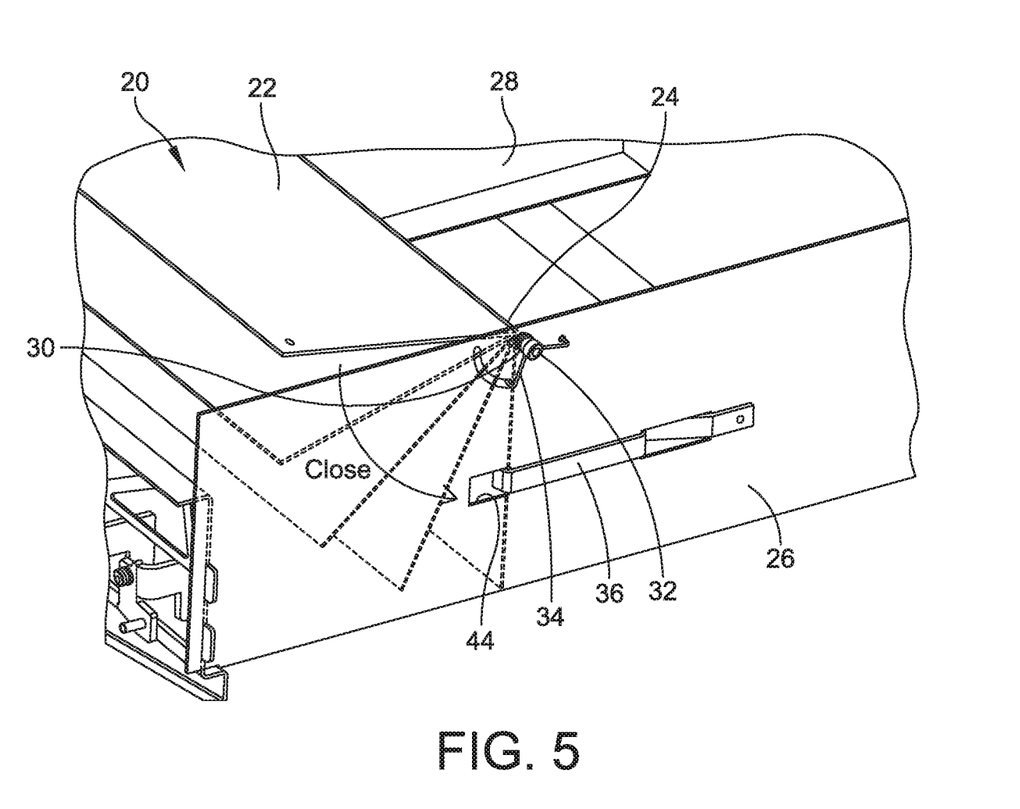
FIG. 5 is a perspective detail view of the safety cover assembly shown in FIG. 4.
Figure 6A:
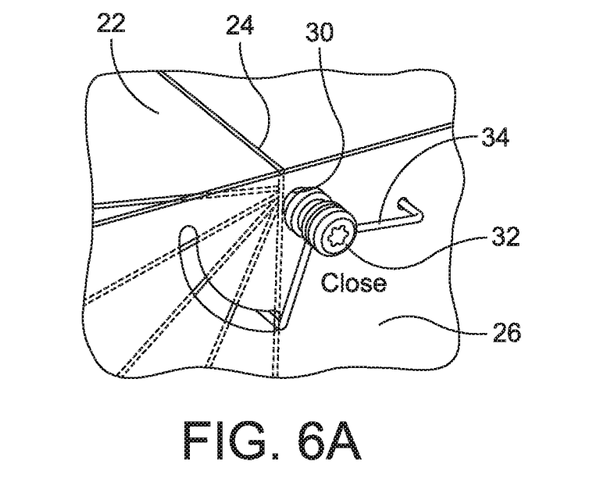
FIG. 6A is an enlarged perspective view of a cover of the safety cover assembly shown in an open position.
Figure 6B:
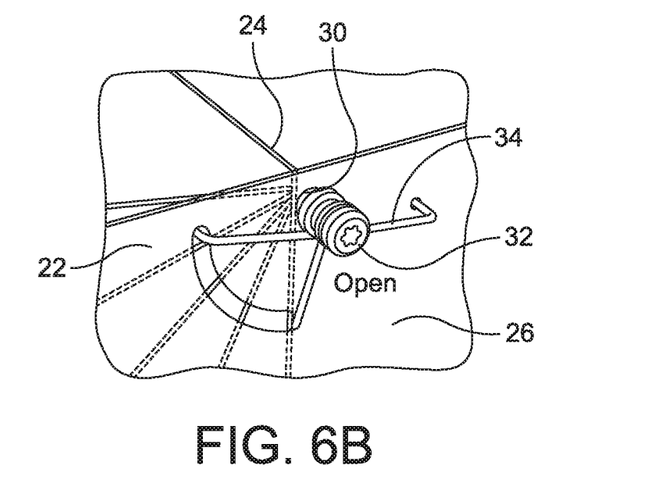
FIG. 6B is an enlarged perspective view of the cover shown in a closed position.

Referring to FIGS. 5, 6A and 6B, in one embodiment, the ends of the hinge 24 can be threaded to receive threaded nuts 32 to secure the hinge and the cover 22 in place. Once secured, the cover 22 is able to move from a closed position in which the cover blocks access to the back of the equipment rack within the mounting slot 14 to an open position in which the cover is rotated about the hinge 24 to enable the power module 16 to be installed within the mounting slot. In another embodiment, the hinge 24 can embody stub shafts that are provided at the top edges of the cover that function the same way as the hinge that is described above and shown in the drawing figures.

In one embodiment, gravity enables the natural disposition of the cover 22 in the closed position. However, to provide more closing force, the safety cover assembly 20 further includes two springs, each indicated at 34, to drive the movement of the cover 22 to the closed position and to maintain the cover in the closed position. As shown in FIG. 5, each spring 34 is a helical torsion spring that is mounted on one end of the hinge 24. For greater closing force two springs are provided, with one spring provided at each end of the hinge. In the shown embodiment, each spring 34 has one end secured to the frame member, e.g., frame member 26, of the chassis 12 of the equipment rack 10 through a small opening provided in the frame member. Each spring 34 further has another end that engages a surface of the cover 22 that faces the back of the equipment rack 10. As described above, the arrangement is such that the springs 34 bias the cover 22 to the closed position. FIG. 6A illustrates the spring 34 holding the cover 22 in the closed position. FIG. 6B illustrates the spring 34 holding the cover 22 in the open position.

Figure 6C:
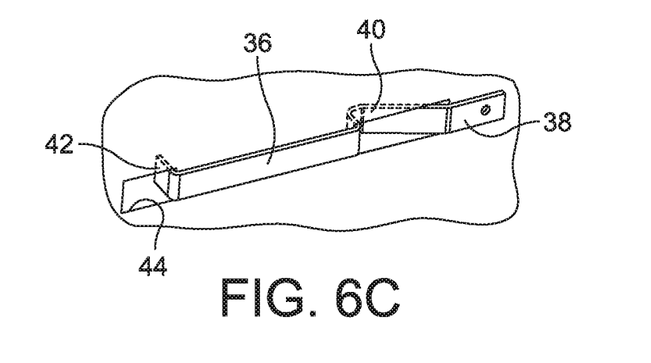
FIG. 6C is an enlarged perspective view of a spring stop lock of the safety cover assembly.

Referring back to FIGS. 4 and 5, and additionally to FIG. 6C, the safety cover assembly 10 further includes, for each frame member 26, 28, a spring stop lock 36 that enables the installation of the power module 16 within the mounting slot 14 of the equipment rack 10 by releasing the cover 22 to free the movement of the cover to the open position. The spring stop lock 36 further provides a stop to maintain the cover 22 in the closed position and to prevent a technician from using a hand or an implement from simply moving the cover to access the back of the equipment rack 10, e.g., the busbar 18. As shown, for each frame member 26, 28, the spring stop lock 36 is positioned within the mounting slot 14 formed in the frame member of the chassis 12 of the equipment rack 10. Although two spring stop locks 36 are illustrated in FIG. 4, it should be noted that only one spring stop lock may be provided on one of the frame members, e.g., frame member 26, to lock the cover 22 in place in its closed position.

In one embodiment, each spring stop lock 36 embodies a flat spring having a flat end 38 that is secured to the frame member, e.g., frame member 26, of the chassis 12 of the equipment rack 10 by a rivet or some other type of suitable fastener. The spring stop lock 36 further has a bent portion 40 and an inwardly bent opposite end 42. As best shown in FIG. 6C, the flat end 38 of the spring stop lock 36 is secured to the frame member, e.g., frame member 26, with the bent portion 40 extending inboard within an elongate opening 44 into the interior of the chassis 12 with respect to the frame member. The bent end 42 of the spring stop lock 36, which extends perpendicularly within the interior of the chassis 12, maintains the cover 22 in the closed position when the power module 16 is not positioned within the mounting slot 14. The bent portion 40 of the spring stop lock 36, which extends through the elongate opening 44, is sized so that the power module engages the bent portion to move the spring lock stop in an outboard direction when installing the power module within the mounting slot 14.

During installation, the power module 16 engages the bent portions 40 of the spring stop locks 36 thereby moving the bent ends 42 away from the cover 22 to enable the movement of the cover to the open position. The movement of the power module mass is sufficient to overcome the spring force of the spring stop locks 36 and the force of the springs 34 associated with the cover 22 to enable the movement of the cover to the open position.

Figure 7:
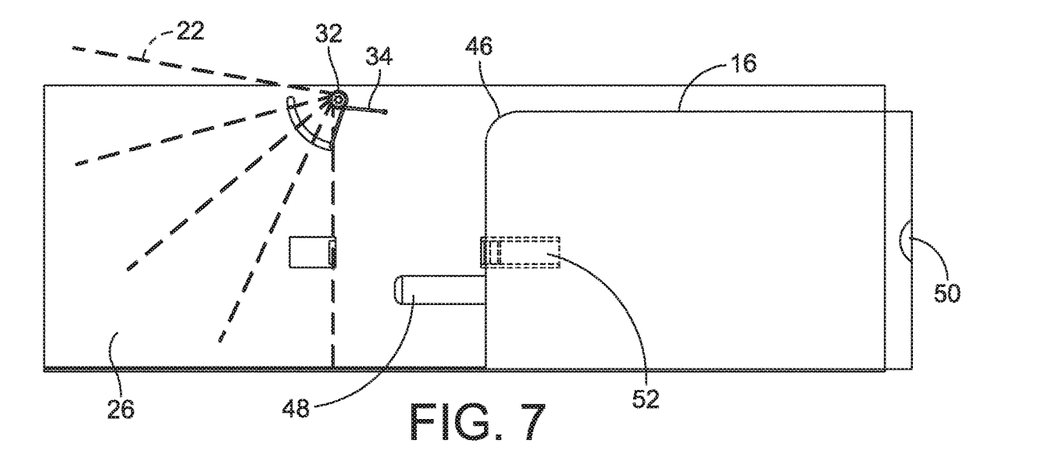
FIG. 7 is a side view of a safety cover assembly and a power module of another embodiment of the disclosure.

Referring to FIG. 7, in one embodiment, the power module 16 may be configured with a rounded corner 46 to gently engage the cover 22 of the safety cover assembly 20 when installing the power module within the mounting slot 14 of the chassis 12 of the equipment rack 10. In another embodiment, or additionally, the power module 16 may include a push pin 48 provided at a back of the power module to engage the cover 22 of the safety cover assembly 20 during installation.

The power module 16 can include a stop feature 50 to block the complete removal of the power module from the mounting slot 14. Specifically, the stop feature 50 operates with a button provided with a feature 52 associated with the frame member, e.g., frame member 26, of the chassis 12 the capture the stop feature 50 when the power module 16 is fully inserted within its respective slot 14. In one embodiment, the stop feature 50 is fabricated from plastic or spring material, and can be depressed to allow the removal of the power module 16 from the mounting slot 14.

Figure 8A:
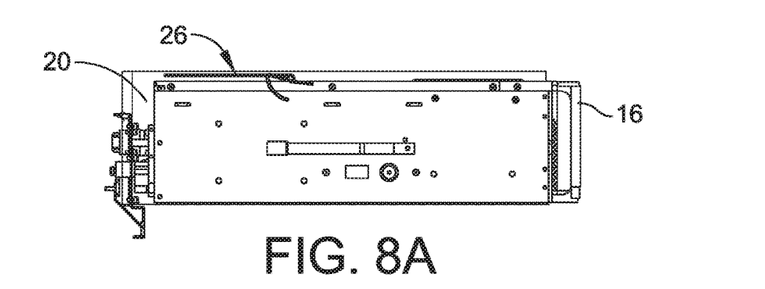
FIGS. 8A-8C are side views showing the removal of the power module from the equipment rack with the cover of the safety cover assembly moving from an open position to a closed position.
Figure 8B:
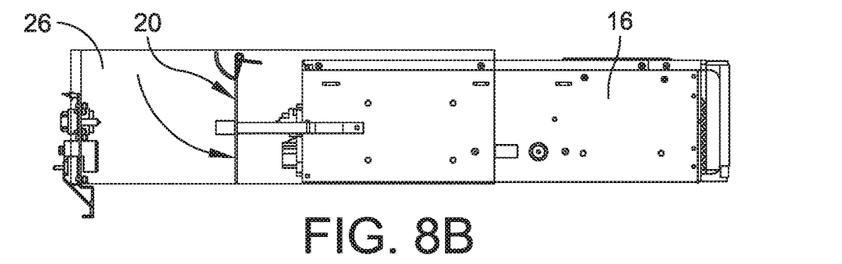
Figure 8C:
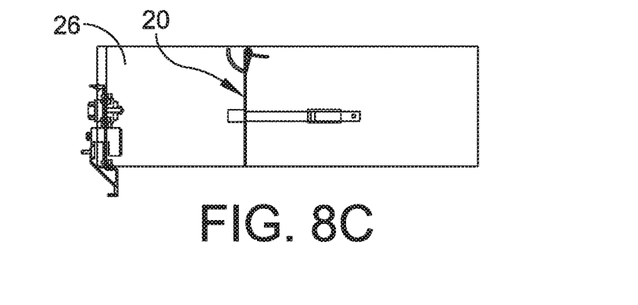

FIGS. 8A-8C illustrate the removal of the power module 16 from the mounting slot 14 of the chassis 12 of the equipment rack 10 and the movement of the cover 22 of the safety cover assembly 20 from the open position to the closed position. FIG. 8A shows the power module 16 in an installed position with the bent portions 40 of the spring stop locks 36 engaged by the power module to move the spring stop locks in an outboard direction. FIG. 8B shows the power module 16 pulled out of the mounting slot 14 approximately halfway out of a length of the mounting slot. In this position, the cover 22 is rotated to the closed position based on gravity or the springs 34. FIG. 8C shows the complete removal of the power module 16 from the mounting slot 14 of the chassis 12 of the equipment rack 10. In this position, the spring stop locks 36 move inwardly to enable the bent ends 42 to capture the cover 22 of the safety cover assembly 20 in the closed position.

Figure 9A:
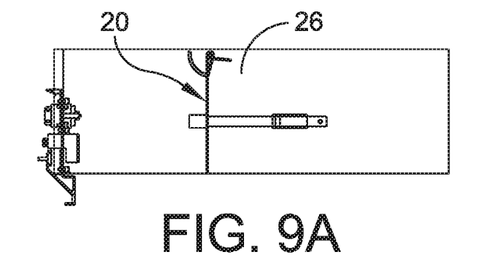
FIGS. 9A-9C are side views showing the installation of the power module from the equipment rack with the cover of the safety cover assembly moving from the closed (or blocking) position to the open position.
Figure 9B:
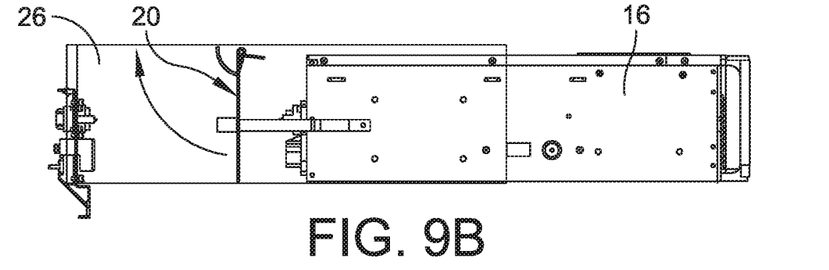
Figure 9C:
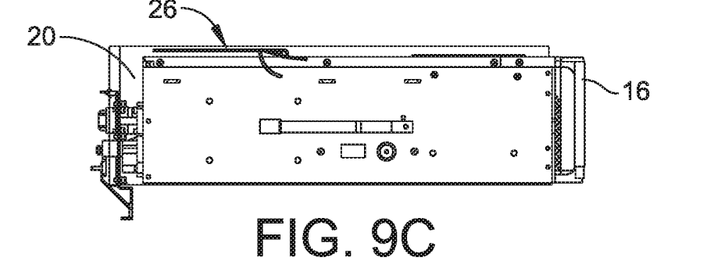

FIGS. 9A-9C illustrate the installation of the power module 16 within the mounting slot 14 of the chassis 12 of the equipment rack 10 and the movement of the cover 22 of the safety cover assembly 20 from the closed position to the open position. FIG. 9A shows the cover 22 of the safety cover assembly 20 in the locked, closed position. FIG. 9B shows the power module 16 being installed within the mounting slot 14 of the chassis 12 of the equipment rack 10 with the power module being positioned approximately halfway within a length of the mounting slot. In this position, the power module 16 engages the bent portions 40 of the spring stop locks 36 to unlock the cover 22 of the safety cover assembly 20 thereby enabling the movement of the cover from the closed position to the open position. FIG. 9C shows the power module 16 fully installed within the mounting slot 14 with the cover 22 of the safety cover assembly 20 in the open position. In this position, the power module 16 can be electrically coupled to the busbar 18 provided at the back of the equipment rack 10.

Figure 10A:
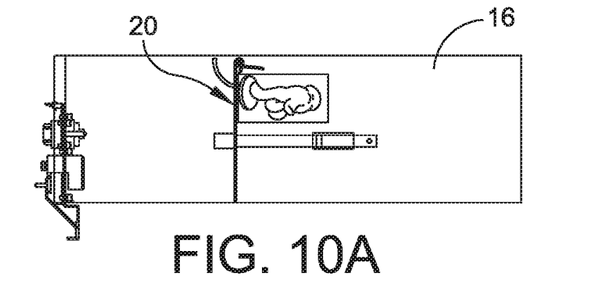
FIGS. 10A and 10B are side views showing the manual movement of the cover of the safety cover assembly from the closed or blocking position to the open position.
Figure 10B:
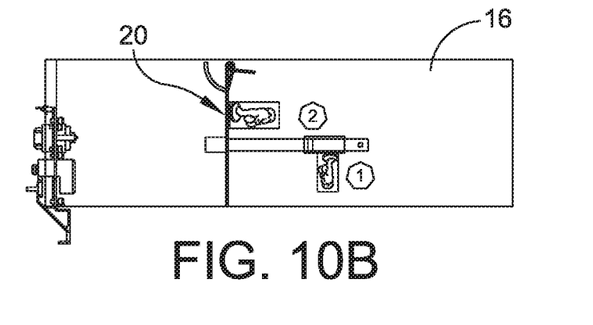

FIGS. 10A and 10B illustrate the manner in which a technician overrides the locking features of the spring stop locks 36 to access the back of the equipment rack 10. FIG. 10A shows the cover 22 in the locked, closed position in which a force applied by a technician either by hand or by implement cannot move the cover of the safety cover assembly 20. FIG. 10B shows the pressing of buttons associated with the spring stop locks 36 (e.g., bent portion 40) to release the cover 22 thereby enabling the movement of the cover to the open position.

Thus, it should be observed that embodiments of the present disclosure are directed to a safety cover assembly that functions as an automatic lock when a power module is removed from an equipment rack. A rear busbar, which is often live, meaning that power runs through it, does not require wrapping, which improves thermal efficiency. The safety cover assembly does not need tooling to lock the cover of the safety cover assembly in place. The cover locks automatically after the power module is removed from the equipment rack. The cover prevents hot air from a rear of equipment rack to recirculate to a front of equipment rack, thus causing hotter operation of the remaining power modules within the equipment rack. The safety cover assembly enables service technicians to safely work on the equipment rack without risk of accessing the live busbar at the location where the power module was removed.

Embodiments of the safety cover assembly enable the cover to move to a deployed or blocking position in which the cover drops down by spring or gravity force when the power module is removed from the equipment rack. In this position, the cover is locked in place by at least one spring lock stop associated with the safety cover assembly. The cover can be moved to an open or concealed position when the power module is installed within the equipment rack. If the service technician wishes to access the live busbar or any other component positioned at the rear of the equipment rack, the technician can move the cover to the open position manually by pressing a button on each spring stop lock.

The safety cover assembly includes a sheet metal cover that can rotate around a spindle, which is fixed to a frame. The cover rotates by gravity or a spring on side. There are spring stop locks at side of cover, it can lock the cover. The power module includes a rounded corner or push pins at the rear of the module that function to move the cover to avoid damaging the cover when installing the power module.

One alternative to the safety cover assembly can include removing the spring on the cover so the cover drops by gravity. Another alternative is to replace the spring with a magnet and/or provide a single spring instead of two springs. Another alternative is to replace the spring stop lock with an electromagnet and/or provide a single spring stop lock instead of two spring stop locks. Yet another embodiment is to replace the hinge with a standard hinge. The cover may include cutouts or openings to reduce its mass.

Although embodiments of the present disclosure illustrate power distribution modules being installed into and removed from the equipment rack, it should be understood that the safety cover assembly of embodiments of the present disclosure can be employed within an equipment rack having any type of electronic module or device in a manner similar to the power distribution module.

Having thus described several aspects of at least one embodiment of this disclosure, it is to be appreciated various alterations, modifications, and improvements will readily occur to those skilled in the art. Such alterations, modifications, and improvements are intended to be part of this disclosure, and are intended to be within the spirit and scope of the disclosure. Accordingly, the foregoing description and drawings are by way of example only.

What is claimed is:

1. A cover assembly for preventing access within a mounting slot of an equipment rack, the equipment rack including a chassis having an open power source located at a back of the chassis and first and second frame members that define a mounting slot configured to receive a power module in a position in which the power module engages the open power source, the assembly comprising:
 a cover sufficiently sized to block access to the back of the equipment rack, the cover being secured to the frame members by at least one hinge, the cover being configured to rotate between a closed position in which the cover blocks access to the open power source and an open position in which the cover is rotated to enable installation of a power module in the mounting slot; and
 a first spring stop lock provided the first frame member, the first spring stop lock being configured to lock the cover in the closed position and to release the cover to enable an installation of the power module within the mounting slot of the equipment rack.

2. The cover assembly of claim 1, wherein the first spring stop lock is positioned within a first slot formed in the first frame member.

3. The cover assembly of claim 2, further comprising a second spring stop lock provided in the second frame member, the second spring stop lock being configured to lock the cover in the closed position and to release the cover to enable an installation of the power module within the mounting slot of the equipment rack.

4. The cover assembly of claim 3, wherein the second spring stop lock is positioned within a second slot formed in the second frame member.

5. The cover assembly of claim 4, wherein each spring stop lock embodies a flat spring including a flat end that is secured to its respective frame member of the chassis of the equipment rack.

6. The cover assembly of claim 5, wherein each spring stop lock further includes a bent portion and an inwardly bent opposite end.

7. The cover assembly of claim 6, wherein the bent portion extends inboard within the mounting slot into the interior of the chassis with respect to its respective frame member.

8. The cover assembly of claim 6, wherein the bent end extends perpendicularly within the interior of the chassis to maintain the cover in the closed position when a power module is not positioned within the mounting slot.

9. The cover assembly of claim 6, wherein the spring stop lock further includes a stop to maintain the cover in the closed position and to prevent unwanted movement of the cover to the open position to access the back of the equipment rack.

10. The cover assembly of claim 1, wherein the at least one hinge extends along a top edge of the cover beyond side edges of the cover, with opposite ends of the hinge extending through respective openings of the frame members.

11. The cover assembly of claim 1, further comprising a spring to drive the cover to the closed position.

12. The cover assembly of claim 11, wherein the spring is a helical torsion spring that is mounted on one end of the hinge, the spring having one end secured to the first frame member through a small opening provided in the frame member and another end that engages a surface of the cover that faces the back of the equipment rack.

13. A method of selectively blocking access to a portion of an equipment rack within a mounting slot of a chassis of the equipment rack with a cover assembly, the method comprising:
 mounting a cover of the cover assembly within the mounting slot, the cover being sufficiently sized to block access to a back of the equipment rack to prevent access to an open power source, the cover being secured to first and second frame members of the chassis by at least one hinge, the cover being configured to rotate between a closed position in which the cover blocks access to the open power source and an open position in which the cover is rotated to enable installation of a power module in the mounting slot; and
 selectively locking the cover in the closed position with a first spring stop lock provided the first frame member, the first spring stop lock being configured to lock the cover in the closed position and to release the cover to enable an installation of the power module within the mounting slot of the equipment rack.

14. The method of claim 13, further comprising positioning the first spring stop lock within a first slot formed in the first frame member and positioning a second spring stop lock within a second slot formed in the second frame member.

15. The method of claim 14, wherein each spring stop lock embodies a flat spring including a flat end that is secured to the frame member of the chassis of the equipment rack, a bent portion, and an inwardly bent opposite end, the bent portion extending inboard within the mounting slot into the interior of the chassis with respect to the frame member.

16. The method of claim 15, wherein the bent end extends perpendicularly within the interior of the chassis to maintain the cover in the closed position when a power module is not positioned within the mounting slot.

17. The method of claim 13, further comprising biasing a movement of the cover to the closed position with a spring.

18. An equipment rack comprising:
 a chassis;
 an open power source located at a back of the chassis;
 first and second frame members that define a mounting slot configured to receive a power module in a position in which the power module engages the open power source; and
 a cover assembly including a cover sufficiently sized to block access to the back of the equipment rack, the cover being secured to the frame members by at least one hinge, the cover being configured to rotate between a closed position in which the cover blocks access to the open power source and an open position in which the cover is rotated to enable installation of a power module in the mounting slot, and a first spring stop lock provided the first frame member, the first spring stop lock being configured to lock the cover in the closed position and to release the cover to enable an installation of the power module within the mounting slot of the equipment rack.

19. The equipment rack of claim 18, wherein the first spring stop lock is positioned within a first slot formed in the first frame member, the equipment rack further comprising a second spring stop lock positioned within a second slot formed in the second frame member.

20. The equipment rack of claim 19, wherein each spring stop lock embodies a flat spring having a flat end that is secured to its respective frame member of the chassis of the equipment rack, a bent portion, and an inwardly bent opposite end, the bent portion extending inboard within the mounting slot into the interior of the chassis with respect to its respective frame member.

* * * * *